United States Patent
Schkufza et al.

(10) Patent No.: US 11,573,817 B2
(45) Date of Patent: Feb. 7, 2023

(54) COMPILER-DRIVER PROGRAMMABLE DEVICE VIRTUALIZATION IN A COMPUTING SYSTEM

(71) Applicant: VMware, Inc., Palo Alto, CA (US)

(72) Inventors: Eric Schkufza, Palo Alto, CA (US); Christopher J. Rossbach, Austin, TX (US)

(73) Assignee: VMware, Inc., Palo Alto, CA (US)

(*) Notice: Subject to any disclaimer, the term of this patent is extended or adjusted under 35 U.S.C. 154(b) by 440 days.

(21) Appl. No.: 16/934,332

(22) Filed: Jul. 21, 2020

(65) Prior Publication Data

US 2022/0027181 A1    Jan. 27, 2022

(51) Int. Cl.
*G06F 9/455* (2018.01)
*G06F 30/331* (2020.01)
*G06F 30/323* (2020.01)

(52) U.S. Cl.
CPC ........ *G06F 9/45558* (2013.01); *G06F 30/323* (2020.01); *G06F 30/331* (2020.01); *G06F 2009/45562* (2013.01)

(58) Field of Classification Search
CPC .. G06F 9/4552; G06F 9/45558; G06F 30/323; G06F 30/331; G06F 2009/455562; G06F 8/41; G06F 8/65
See application file for complete search history.

(56) References Cited

PUBLICATIONS

Kirchgessner, Robert et al., 2015. Low-Overhead FPGA Middleware for Application Portability and Productivity. ACM Trans. Reconfigurable Technol. Syst. 8, 4, Article 21 (Sep. 2015), 22 pages, https://doi.org/10.1145/2746404.
Kirchgessner, Robert et al., 2012, VirtualRC: A Virtual FPGA Platform for Applications and Tools Portability. In Proceedings of the ACM/SIGDA International Symposium on Field Programmable Gate Arrays (FPGA '12). ACM, New fork, NY, USA, 205-208. https://doi.org/10.1145/2145694.2145728.
Knodel, Oliver et al., 2016. RC3E: Reconfigurable Accelerators in Data Centres and their Provision by Adapted Service Models. In 2016 IEEE 9th International Conference on Cloud Computing (CLOUD). 19-26. https://doi.org/10.1109/CLOUD.2016.0013.
Knodel, Oliver et al., 2015, RC3E: Provision and Management of Reconfigurable Hardware Accelerators in a Cloud Environment. CoRR abs/1508.06843 (2015). arXiv:1508.06843.
Koch, Dirk et al., 2013. An Efficient FPGA Overlay for Portable Custom Instruction Set Extensions. In FPL. IEEE, 1-8.

(Continued)

*Primary Examiner* — Jack Chiang
*Assistant Examiner* — Aric Lin
(74) *Attorney, Agent, or Firm* — Dinsmore & Shohl LLP

(57) ABSTRACT

Examples provide a method of virtualizing a hardware accelerator in a virtualized computing system. The virtualized computing system includes a hypervisor supporting execution of a plurality of virtual machines (VMs). The method includes: receiving a plurality of sub-programs at a compiler in the hypervisor from a plurality of compilers in the respective plurality of VMs, each of the sub-programs including a hardware-description language (HDL) description; combining, at the compiler in the hypervisor, the plurality of sub-programs into a monolithic program; generating, by the compiler in the hypervisor, a circuit implementation for the monolithic program, the circuit implementation including a plurality of sub-circuits for the respective plurality of sub-programs; and loading, by the compiler in the hypervisor, the circuit implementation to a programmable device of the hardware accelerator.

20 Claims, 9 Drawing Sheets

(56) References Cited

PUBLICATIONS

Koeplinger, David et al., 2016. Automatic Generation of Efficient Accelerators for Reconfigurable Hardware. In Proceedings of the 43rd International Symposium on Computer Architecture (ISCA '16). IEEE Press, Piscataway, NJ, USA, 115-127. https://doi.org/10.1109/ISCA.2016.20.

Koeplinger, David et al., 2018. Spatial: A Language and Compiler for Application Accelerators. In Proceedings of the 39th ACM SIGPLAN Conference on Programming Language Design and Implementation (PLDI 2018). ACM, New York, NY, USA, 296-311.https://doi.org/10.1145/3192366.3192379.

Lebak, James et al., 2005. Parallel VSIPL++: An Open Standard Software Library for High-Performance Parallel Signal Processing. Proc. IEEE 93, 2 (2005), 313-330.

Lebedev, Ilia et al., 2012. Exploring Many-Core Design Templates for FPGAs and ASICs. Int. J. Reconfig. Comp. 2012 (2012), 439141:1-439141:15. https://doi.org/10.1155/2012/439141.

Leber, Christian et al., 2011. High Frequency Trading Acceleration using FPGAs. In Proceedings of the 2011 21st International Conference on Field Programmable Logic and Applications(FPL '11). IEEE Computer Society, Washington, DC, USA, 317-322.https://doi.org/10.1109/FPL.2011.64.

Lee, Trong-Yen et al., 2010, Hardware Context-Switch Methodology for Dynamically Partially Reconfigurable Systems. J. Inf. Sci. Eng. 26 (2010), 1289-1305.

Levinson, L. et al., 2000. Preemptive Multitasking on FPGAs. In Field-Programmable Custom Computing Machines, 2000 IEEE Symposium on. 301-302. https://doi.org/10.1109/FPGA.2000.903426.

Li, Sheng et al., 2015. Architecting to Achieve a Billion Requests Per Second Throughput on a Single Key-Value Store Server Platform. In Proceedings of the 42Nd Annual International Symposium on Computer Architecture (ISCA '15). ACM, New York, NY, USA, 476-488. https://doi.org/10.1145/2749469.2750416.

Lübbers, Enno et al., 2009. ReconOS: Multithreaded Programming for Reconfigurable Computers. ACM Trans. Embed. Comput. Syst. 9, 1, Article 8 (Oct. 2009), 33 pages. https://doi.org/10.1145/1596532.1596540.

Mirza, Diba et al., 2019. PyRTL in Early Undergraduate Research. In Proceedings of the Workshop on Computer Architecture Education (WCAE'19). ACM, New York, NY, USA, Article 6, 8 pages, http://doi.acm.org/10.1145/3338698.3338890.

Mishra, Mahim et al., 2006. Tartan: Evaluating Spatial Computation for Whole Program Execution. SIGOPS Oper. Syst. Rev 40, 5 (Oct. 2006), 163-174. https://doi.org/10.1145/1168917.1168878.

Moore, Nicholas et al., 2007. An Extensible Framework for Application Portability Between Reconfigurable Supercomputing Architectures.

NEC. [n. d.]. neoface | NEC Today. http://nectoday.com/tag/neoface/ (Accessed Apr. 2019).

Oguntebi, Tayo et al., 2016. GraphOps: A Dataflow Library for Graph Analytics Acceleration. In Proceedings of the 2016 ACM/SIGDA International Symposium on Field-Programmable Gate Arrays (FPGA '16).ACM, NewYork,NY, USA, 111-117. https://doi.org/10.1145/2847263.2847337.

Peck, Wesley et al., 2006. Hthreads: A Computational Model for Reconfigurable Devices.. In FPL. IEEE, 1-4.

Pham, Khoa Dang et al., 2013. Microkernel Hypervisor for a Hybrid ARM-FPGA Platform. In Application-Specific Systems, Architectures and Processors (ASAP),2013 IEEE 24th International Conference on. 219-226. https://doi.org/10.1109/ASAP.2013.6567578.

Phothilimthana, Phitchaya Mangpo et al., 2018. Floem: A Programming System for NIC-Accelerated Network Applications. In 13th USENIX Symposium on Operating Systems Design and Implementation,OSDI 2018, Carlsbad, CA, USA, Oct. 8-10, 2018. 663-679. https://www.usenix.org/conference/osdi18/presentation/phothilimthana.

Plessl, Christian et al., 2005. Zippy-A coarse-grained reconfigurable array with support for hardware virtualization. In Application-Specific Systems, Architecture Processors, 2005. ASAP 2005.16th IEEE International Conference on. IEEE, 213-218.

Pool, M. et al., 2016. distcc: A free distributed C/C++ compiler system.https://github.com/distcc/distcc.

Prabhakar, Raghu et al., 2017. Plasticine: A Reconfigurable Architecture for Parallel Patterns. In Proceedings of the 44th Annual International Symposium on Computer Architecture (ISCA '17). ACM, New York, NY, USA, 389-402. https://doi.org/10.1145/3079856.3080256.

Putnam, Andrew et al., 2014. A Reconfigurable Fabric for Accelerating Large-Scale Datacenter Services. In 41st Annual International Symposium on Computer Architecture (ISCA). http://research.microsoft.com/apps/pubs/default.aspx?id=212001.

Rupnow, Kyle et al., 2009. Block, Drop or Roll(back): Alternative Preemption Methods for RH Multi-Tasking. In FCCM 2009, 17th IEEE Symposium on Field Programmable Custom Computing Machines, Napa, California, USA, Apr. 5-7, 2009, Proceedings.63-70. https://doi.org/10.1109/FCCM.2009.30.

Schkufza, Eric et al., 2019. Just-In-Time Compilation for Verilog: A New Technique for Improving the FPGA Programming Experience, In Proceedings of the Twenty-Fourth International Conference on Architectural Support for Programming Languages and Operating Systems, ASPLOS 2019, Providence, RI, USA, Apr. 13-17, 2019, 271-286.

Shan, Yi et al., 2010. FPMR: MapReduce Framework on FPGA. In FPGA (Mar. 1, 2010),Peter Y. K. Cheung and John Wawrzynek (Eds.). ACM, 93-102. http://dblp.uni-trier.de/db/conf/fpga/fpga2010.html#ShanWYWXY10.

Sharma, Hardi et al., 2016. DnnWeaver: From High-Level Deep Network Models to FPGA Acceleration. In theWorkshop on Cognitive Architectures.

So, Hayden Kwok-Hay et al., 2008. A Unified Hardware/Software Runtime Environment for FPGA-Based Reconfigurable Computers using BORPH. ACM Trans. Embed. Comput. Syst. 7, 2, Article 14 (Jan. 2008), 28 pages. https://doi.org/10.1145/1331331.1331338.

So, Hayden Kwok-Jay et al., 2007. BORPH: An Operating System for FPGA-Based Reconfigurable Computers. Ph.D. Dissertation. EECS Department, University of California, Berkeley. http://www.eecs.berkeley.edu/Pubs/TechRpts/2007/EECS-2007-92.html.

So, Hayden Kwok-Hay et al., 2016. OLAF'16: Second International Workshop on Overlay Architectures for FPGAs. In Proceedings of the 2016 ACM/SIGDA International Symposium on Field-Programmable Gate Arrays (FPGA '16). ACM, New York, NY, USA, 1-1.https://doi.org/10.1145/2847263.2847345.

Steiger, Christophe et al., 2004. Operating Systems for Reconfigurable Embedded Platforms: Online Scheduling of Real-Time Tasks. IEEE Trans. Comput. 53, 11 (Nov. 2004), 1393-1407. https://doi.org/10.1109/TC.2004.99.

Stitt, Greg et al., 2011. Intermediate Fabrics: Virtual Architectures for Near-Instant FPGA Compilation. IEEE Embedded Systems Letters 3,3 (Sep. 2011), 81-84. https://doi.org/10.1109/LES.2011.2167713.

Suda, Naveen et al., 2016. Throughput-Optimized OpenCL-based FPGA Accelerator for Large-Scale Convolutional Neural Networks. In Proceedings of the 2016 ACM/SIGDA International Symposium on Field-Programmable Gate Arrays (FPGA '16). ACM,New York, NY, USA, 16-25. https://doi.org/10.1145/2847263.2847276.

Surhone, Lambert M. et al., 2010. Node.Js. Betascript Publishing, Mauritius.

Thomas, Donald et al., 2008. The Verilog® Hardware Description Language. Springer Science & Business Media.

Tridgell, A. et al., 2016. ccache: A Fast C/C++ Compiler Cache. https://ccache.samba.org.

Tsutsui, A. et al., 1995. Special Purpose FPGA for High-speed Digital Telecommunication Systems. In Proceedings of the 1995 International Conference on Computer Design:VLSI in Computers and Processors (ICCD '95). IEEE Computer Society .Washington, DC, USA, 486-491. http://dl.acm.org/citation.cfm?id=645463.653355.

Wassi, G. et al., 2014. Multi-shape tasks scheduling for online multitasking on FPGAs. In Reconfigurable and Communication-Centric Systems-on-Chip (ReCoSoC), 2014 9th International Symposium on. 1-7. https://doi.org/10.1109/ReCoSoC.2014.6861366.

(56) References Cited

PUBLICATIONS

Watkins, Matthew A. et al., 2010. ReMAP: A Reconfigurable Heterogeneous Multicore Architecture. In Proceedings of the 2010 43rd Annual IEEE/ACM International Symposium on Microarchitecture (MICRO '43). IEEE Computer Society, Washington, DC, USA,497-508. https://doi.org/10.1109/MICRO.2010.15.

Weerasinghe, Jagath et al., 2015. Enabling FPGAs in Hyperscale Data Centers. In 2015 IEEE 12th Intl Conf on Ubiquitous Intelligence and Computing and 2015 IEEE 12th Intl Conf on Autonomic and Trusted Computing and 2015 IEEE 15th Intl Conf on Scalable Computing and Communications and Its Associated Workshops (UIC-ATC-ScalCom), Beijing, China, Aug. 10-14, 2015. 1078-1086.

Werner, Stephan et al., 2012. Virtualized On-Chip Distributed Computing for Heterogeneous Reconfigurable Multi-Core Systems. In Proceedings of the Conference on Design, Automation and Test in Europe (DATE '12).EDA Consortium, San Jose, CA, USA, 280-283. http://dl.acm.org/citation.cfm?id=2492708.2492778.

Wiersema, Tobias et al., 2014. Embedding FPGA Overlays into Configurable Systems-on-chip: ReconOS meets ZUMA. In ReConFig. IEEE, 1-6.

Winterstein, Felix et al., 2015. MATCHUP: Memory Abstractions for Heap Manipulating Programs. In Proceedings of the 2015ACM/SIGDA International Symposium on Field-Programmable GateArrays (FPGA '15). ACM, New York, NY, USA, 136-145. https://doi.org/10.1145/2684746.2689073.

Xilinx. [n. d.]. SDAccel Development Environment. (Accessed on Jul. 17, 2018).

Xilinx. 2018. Vivado Design Suite, https://www.xilinx.com/products/design-tools/vivado.html.

Zhang, Chen et al., 2015. Optimizing FPGA-Based Accelerator Design for Deep Convolutional Neural Network. In Proceedings of the 2015ACM/SIGDA International Symposium on Field-Programmable Gate Arrays (FPGA '15). ACM, New York, NY, USA, 161-170. https://doi.org/10.1145/2684746.2689060.

[N. d.], Cadence Palladium Xp II Verification Computing Platform, https://www.cadence.com/content/dam/cadence-www/global/enUS/documents/tools/system-design-verification/palladium-xpiitb.pdf. (Accessed Jan. 2019).

2017, Device Handbook—Altera Cyclone V.

Adler, Michael et al., 2011, Leap Scratchpads: Automatic Memory and Cache Management for the 19th ACM/SIGDA International Symposium on Field Programmable Reconfigurable Logic, In Proceedings of Gate Arrays (FPGA '11), ACM, New York, NY, USA, 25-28. https://doi.org/10.1145/1950413.1950421.

Aehlig, K. et al., 2016, Bazel: Correct, reproducible, fast builds for everyone. https://bazel.io.

Anderson, Erik et al., 2006, Enabling a Uniform Programming Model Across the Software/Hardware Boundary, FCCM 06.

Auerbach, Joshua et al., 2010, Lime: a Java-Compatible and Synthesizable Language for Heterogeneous Architectures, In Proceedings of the ACM International Conference on Object Oriented Programming Systems Languages and Applications (OOPSLA '10), ACM, New York, NY, USA, 89-108. https://doi.org/10.1145/1869459.1869469.

Bachrach, Jonathan et al., 2012, Chisel: Constructing Hardware in a Scala Embedded Language, In the 49th Annual Design Automation Conference 2012, DAC '12, San Francisco, CA, USA, Jun. 3-7, 2012. 1216-1225. https://doi.org/10.1145/2228360.2228584.

Bhasker, Jayaram, 1999, A VHDL primer, Prentice-Hall.

Brant, Alexander et al., 2012, ZUMA: An open FPGA overlay architecture, In Field-Programmable Custom Computing Machines (FCCM), 2012 IEEE 20th Annual International Symposium on, IEEE, 93-96.

Brebner, Gordon, 1996, A Virtual Hardware Operating System for the Xilinx XC6200, In Proceedings of the 6th International Workshop on Field-Programmable Logic, Smart Applications, New Paradigms and Compilers (FPL '96), Springer-Verlag, London, UK, UK, 327-336. http://dl.acm.org/citation.cfm?id=647923.741195.

Byma, Stuart et al., 2014, FPGAs in the Cloud: Booting Virtualized Hardware Accelerators with OpenStack, In Proceedings of the 2014 IEEE 22Nd International Symposium on Field-Programmable Custom Computing Machines (FCCM '14), IEEE Computer Society,Washington, DC, USA, 109-116.

Byma, Stuart et al., 2015, Expanding OpenFlow Capabilities with Virtualized Reconfigurable Hardware. In Proceedings of the 2015 ACM/SIGDA International Symposium on Field-Programmable Gate Arrays (FPGA '15), ACM, New York, NY, USA, 94-97, https://doi.org/10.1145/2684746.2689086.

Casper, Jared et al., 2014, Hardware Acceleration of Database Operations. In Proceedings of the 2014 ACM/SIGDA International Symposium on Field-programmable Gate Arrays (FPGA '14), ACM, New York, NY, USA, 151-160, https://doi.org/10.1145/2554688.2554787.

Caulfield, Adrian M. et al., 2016, A Cloud-Scale Acceleration Architecture, In Proceedings of the 49th Annual IEEE/ACM International Symposium on Microarchitecture, https://www.microsoft.com/en-us/research/publication/configurable-cloud-acceleration/.

Chen, Fei et al., 2014, Enabling FPGAs in the Cloud, In Proceedings of the 11th ACM Conference on Computing Frontiers (CF '14), ACM, New York, NY, USA, Article 3, 10 pages, https://doi.org/10.1145/2597917.2597929.

Chen, Liang et al., 2012, Online Scheduling for Multi-core Shared Reconfigurable Fabric, In Proceedings of the Conference on Design, Automation and Test in Europe (DATE '12), EDA Consortium, San Jose, CA, USA, 582-585. http://dl.acm.org/citation.cfm?id=2492708.2492853.

Chung, Eric et al., 2018, Serving DNNs in Real Time at Datacenter Scale with Project Brainwave, IEEE. https://www.microsoft.com/en-us/research/publication/serving-dnns-real-time-datacenter-scale-project-brainwave/.

Chung, Eric S. et al., 2013, LINQits: Big Data on Little Clients, In 40th International Symposium on Computer Architecture, ACM, http://research.microsoft.com/apps/pubs/default.aspx?id=198052.

Chung, Eric S. et al., 2011, CoRAM: An In-fabric Memory Architecture for FPGA-based Computing, In Proceedings of the 19th ACM/SIGDA International Symposium on Field Programmable Gate Arrays (FPGA '11), ACM, New York, NY, USA, 97-106. https://doi.org/10.1145/1950413.1950435.

Coussy, Philippe et al., 2008, High-Level Synthesis: From Algorithm to Digital Circuit, Springer Science & Business Media.

Crockett, Louise H. et al., 2014, The Zynq Book: Embedded Processing with the Arm Cortex-A9 on the Xilinx Zynq-7000 All Programmable Soc. Strathclyde Academic Media.

Dai, Guohao et al., 2016, FPGP: Graph Processing Framework on FPGA: A Case Study of Breadth-First Search, In Proceedings of the 2016 ACM/SIGDA International Symposium on Field-Programmable Gate Arrays (FPGA '16). ACM, New York, NY, USA, 105-110. https://doi.org/10.1145/2847263.2847339.

Dehon, André et al., 2006, Stream computations organized for reconfigurable execution, Microprocessors and Microsystems 30, 6 (2006), 334-354. https://doi.org/10.1016/j.micpro.2006.02.009.

Dennard, R.H. et al., 1974, Design of Ion-Implanted MOSFET's with Very Small Physical Dimensions, IEEE JSSC 9, 5 (1974), 256-268.

Domahidi, Alexander et al., 2013, ECOS: An SOCP Solver for Embedded Systems, In Control Conference (ECC), 2013 European, IEEE, 3071-3076.

Amazon EC2, 2017, Amazon EC2 F1 Instances, https://aws.amazon.com/ec2/instance-types/f1/.

Eran, Haggai et al., 2019, NICA: An Infrastructure for Inline Acceleration of Network Applications, In 2019 USENIX Annual Technical Conference, USENIX ATC 2019, Renton, WA, USA, Jul. 10-12, 2019. 345-362. https://www.usenix.org/conference/atc19/presentation/eran.

Esfahani, Hamed et al., 2016. CloudBuild: Microsoft's Distributed and Caching Build Service, In Proceedings of the 38th International Conference on Software Engineering, ICSE 2016, Austin, TX, USA, May 14-22, 2016—Companion Volume, 11-20.

Fahmy, Suhaib A. et al., 2015, Virtualized FPGA Accelerators for Efficient Cloud Computing, In Proceedings of the 2015 IEEE 7th

(56) References Cited

PUBLICATIONS

International Conference on Cloud Computing Technology and Science (CloudCom) (CLOUDCOM '15). IEEE Computer Society, Washington, DC, USA, 430-435.

Firestone, Daniel et al., 2018, Azure Accelerated Networking: SmartNICs in the Public Cloud, In Proceedings of the 15th USENIX Conference on Networked Systems Design and Implementation (NSDI'18). USENIX Association, Berkeley, CA, USA, 51-64. http://dl.acm.org/citation.cfm?id=-3307441.3307446.

Fu, Wenyin et al., 2008, Scheduling Intervals for Reconfigurable Computing, In Field-Programmable Custom Computing Machines, 2008, FCCM '08, 16th International Symposium on, 87-96. https://doi.org/10.1109/FCCM.2008.48.

Funk, K. et al., 2016, icecream, https://github.com/icecc/icecream.

Gonzalez, Ivan et al., 2012, Virtualization of reconfigurable coprocessors in HPRC systems with multicore architecture, J. Syst. Archit. 58, 6-7, (Jun. 2012), 247-256. https://doi.org/10.1016/j.sysarc.2012.03.002.

Hamilton, Brandon Kyle et al., 2014, Scheduling Mixed-Architecture Processes in Tightly Coupled FPGA-CPU Reconfigurable Computers, In Field-Programmable Custom Computing Machines (FCCM), 2014 IEEE 22nd Annual International Symposium on, 240-240. https://doi.org/10.1109/FCCM.2014.75.

Arria V Device Handbook, 2012, vol. 1: Device Overview and Datasheet, (2012).

Heydon, Allan et al., 2006, Software Configuration Management Using Vesta, Springer.

Huang, Chun-Hsian et al., 2009, Hardware Resource Virtualization for Dynamically Partially Reconfigurable Systems, IEEE Embed. Syst. Lett. 1, 1 (May 2009), 19-23. https://doi.org/10.1109/LES.2009.2028039.

SRC Computers Inc. 2006. Carte Programming Environment. http://www.srccomp.com/SoftwareElements.htm.

Intel, 2018, Intel Quartus Prime Software, https://www.altera.com/products/design-software/fpga-design/quartusprime/download.html.

Ismail, Aws et al., 2011, FUSE: Front-end user framework for O/S abstraction of hardware accelerators, In Proceedings of the 2011 IEEE 19th Annual International Symposium on Field-Programmable Custom Computing Machines (FCCM '11), IEEE ComputerSociety, Washington, DC, USA, 170-177. https://doi.org/10.1109/FCCM.2011.48.

István, Zsolt et al., 2016, Consensus in a Box: Inexpensive Coordination in Hardware, In Proceedings of the 13th Usenix Conference on Networked Systems Design and Implementation (NSDI'16), USENIX Association, Berkeley, CA, USA, 425-438. http://dl.acm.org/citation.cfm?id=2930611.2930639.

Kaganov, Alexander et al., 2011, FPGA Acceleration of Multi-Factor CDO Pricing, ACM Trans. ReconfigurableTechnol. Syst 4, 2, Article 20 (May 2011), 17 pages. https://doi.org/10.1145/1968502.1968511.

Kalte, H. et al., 2005, Context saving and restoring for multitasking in reconfigurable systems, In Field Programmable Logic and Applications, 2005, International Conference on, 223-228. https://doi.org/10.1109/FPL.2005.1515726.

Kapitza, Rüdiger et al., 2012, CheapBFT: Resource-efficient Byzantine Fault Tolerance, In Proceedings of the 7th ACM European Conference on Computer Systems (EuroSys '12). ACM, New York, NY, USA, 295-308. https://doi.org/10.1145/2168836.2168866.

Kapre, Nachiket et al., 2015, Hoplite: Building Austere Overlay NoCs for FPGAs, In FPL, IEEE, 1-8.

Kara, Kaan et al., 2016, Fast and robust hashing for database operators, In 26th International Conference on Field Programmable Logic and Applications, FPL 2016, Lausanne, Switzeriand, Aug. 29-Sep. 2, 2016, 1-4. https://doi.org/10.1109/FPL.2016.7577353.

Kaufmann, Antoine et al., 2015, FlexNIC: Rethinking Network DMA, In Proceedings of the 15th USENIX Conference on Hot Topics in Operating Systems (HOTOS'15), USENIX Association, Berkeley, CA, USA, 7-7. http://dl.acm.org/citation.cfm?id=2831090.2831097.

Kaufmann, Antoine et al., 2016, High Performance Packet Processing with FlexNIC, In Proceedings of the Twenty-First International Conference on Architectural Support for Programming Languages and Operating Systems (ASPLOS). 15. https://doi.org/10.1145/2872362.2872367.

Khawaja, Ahmed et al., 2018, Sharing, Protection and Compatibility for Reconfigurable Fabric with AMORPHOS, In 13th {USENIX} Symposium on Operating Systems Design and Implementation ({OSDI} 18), 107-127.

Khronos Group, 2009, The OpenCL Specification, Version 1.0, Khronos Group, http://www.khronos.org/registry/cl/specs/opencl-1.0.33.pdf.

$$S\begin{pmatrix} \text{always } @(e_1)\, s_1 \\ \ldots \\ \text{always } @(e_n)\, s_n \end{pmatrix} \Rightarrow \begin{array}{l} \text{always } @(e_1 \text{ or } \ldots \text{ or } e_n) \\ \quad \text{if } (G(e_1)) \text{ begin } S(s_1) \text{ end} \\ \quad \ldots \\ \quad \text{if } (G(e_n)) \text{ begin } S(s_n) \text{ end} \end{array}$$

$$S(\text{begin } s_1 \ldots s_n \text{ end}) \Rightarrow S(s_1) \ldots S(s_n)$$

$$S(\text{fork } s_1 \ldots s_n \text{ join}) \Rightarrow S(s_1) \ldots S(s_n)$$

$$S(s) \Rightarrow s$$

$$G(\text{posedge } x) \Rightarrow \_\text{pos}\_x$$

$$G(\text{negedge } x) \Rightarrow \_\text{neg}\_x$$

$$G(x) \Rightarrow \_\text{any}\_x$$

FIG. 3A

$$\delta(x) \Rightarrow \begin{array}{l} \text{reg } \_px; \\ \text{always } @(\text{posedge }\_\text{clk}) \\ \quad \_px <= x; \end{array}$$

$$\mathcal{D}(\text{posedge } x) \Rightarrow \begin{array}{l} \delta(x) \\ \text{wire }\_\text{pos}\_x = !\_px\ \&\ x; \end{array}$$

$$\mathcal{D}(\text{negedge } x) \Rightarrow \begin{array}{l} \delta(x) \\ \text{wire }\_\text{neg}\_x = \_px\ \&\ !x; \end{array}$$

$$\mathcal{D}(x) \Rightarrow \begin{array}{l} \delta(x) \\ \text{wire }\_\text{any}\_x = \_px\ !=\ x; \end{array}$$

$$C(\text{always } @(\mathcal{E})\, s) \Rightarrow \begin{array}{l} \forall_{e \in \mathcal{E}}\ \mathcal{D}(e) \\ \text{reg}[31:0]\ \_\text{state}; \\ \text{reg}[31:0]\ \_\text{task}; \\ \text{always}@(\text{posedge }\_\text{clk}) \\ \quad Lower(M(s)) \end{array}$$

FIG. 3B

$$\mathcal{M}(s) \Rightarrow \mathcal{M}(S, (()))$$
$$\mathcal{M}(s; S, (r_1, \ldots, r_n)) \Rightarrow \mathcal{M}(S, (r_1, \ldots, r_n \circ s))$$
$$\mathcal{M}(r; S, (r_1, \ldots, r_n)) \Rightarrow \mathcal{M}(S, (r_1, \ldots, r_n \circ r) \circ ())$$
$$\mathcal{M}(\text{if}(c) \, s_1 \text{ else } s_2; S, \mathcal{R}) \Rightarrow \mathcal{M}(S, \mathcal{R} \circ \mathcal{R}' \circ ())$$
$$\text{where } \mathcal{R}' = (c) \circ \mathcal{M}(s_1) \circ \mathcal{M}(s_2)$$
$$\mathcal{M}(\text{case}(c) \, i_1 \ldots i_n; S, \mathcal{R}) \Rightarrow \mathcal{M}(S, \mathcal{R} \circ \mathcal{R}' \circ ())$$
$$\text{where } \mathcal{R}' = (c) \circ \mathcal{M}(i_1) \circ \cdots \circ \mathcal{M}(i_n)$$
$$\mathcal{M}((), \mathcal{R}) \Rightarrow \mathcal{R}$$

FIG. 3C

COMPILER-DRIVER PROGRAMMABLE DEVICE VIRTUALIZATION IN A COMPUTING SYSTEM

BACKGROUND

Computer virtualization is a technique that involves encapsulating a physical computing machine platform into virtual machine(s) executing under control of virtualization software on a hardware computing platform or "host." A virtual machine (VM) provides virtual hardware abstractions for processor, memory, storage, and the like to a guest operating system. The virtualization software, also referred to as a "hypervisor," incudes one or more virtual machine monitors (VMMs) to provide execution environment(s) for the virtual machine(s). As physical hosts have grown larger, with greater processor core counts and terabyte memory sizes, virtualization has become key to the economic utilization of available hardware.

Programmable devices, such as field programmable gate arrays (FPGAs), are increasingly common in modern applications as hardware accelerators in a computing system. As such, cloud provides that operate virtualized computing systems in a data center now support on-demand FPGA acceleration. Applications in data centers run on virtual infrastructure, where consolidation, multitenancy, and workload migration enable economies of scale that are fundamental to the provider's business. However, a general strategy for virtualizing programmable devices on hardware accelerators has yet to emerge.

SUMMARY

One or more embodiments provide a method of virtualizing a hardware accelerator in a virtualized computing system. The virtualized computing system includes a hypervisor supporting execution of a plurality of virtual machines (VMs). The method includes: receiving a plurality of sub-programs at a compiler in the hypervisor from a plurality of compilers in the respective plurality of VMs, each of the sub-programs including a hardware-description language (HDL) description; combining, at the compiler in the hypervisor, the plurality of sub-programs into a monolithic program; generating, by the compiler in the hypervisor, a circuit implementation for the monolithic program, the circuit implementation including a plurality of sub-circuits for the respective plurality of sub-programs; and loading, by the compiler in the hypervisor, the circuit implementation to a programmable device of the hardware accelerator.

Further embodiments include a non-transitory computer-readable storage medium comprising instructions that cause a computer system to carry out the above method, as well as a computer system configured to carry out the above method. Though certain aspects are described with respect to VMs, they may be similarly applicable to other suitable physical and/or virtual computing instances.

BRIEF DESCRIPTION OF THE DRAWINGS

FIGS. 3A-3C depict example transformations used in transforming HDL code having unsynthesizable constructs according to an embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
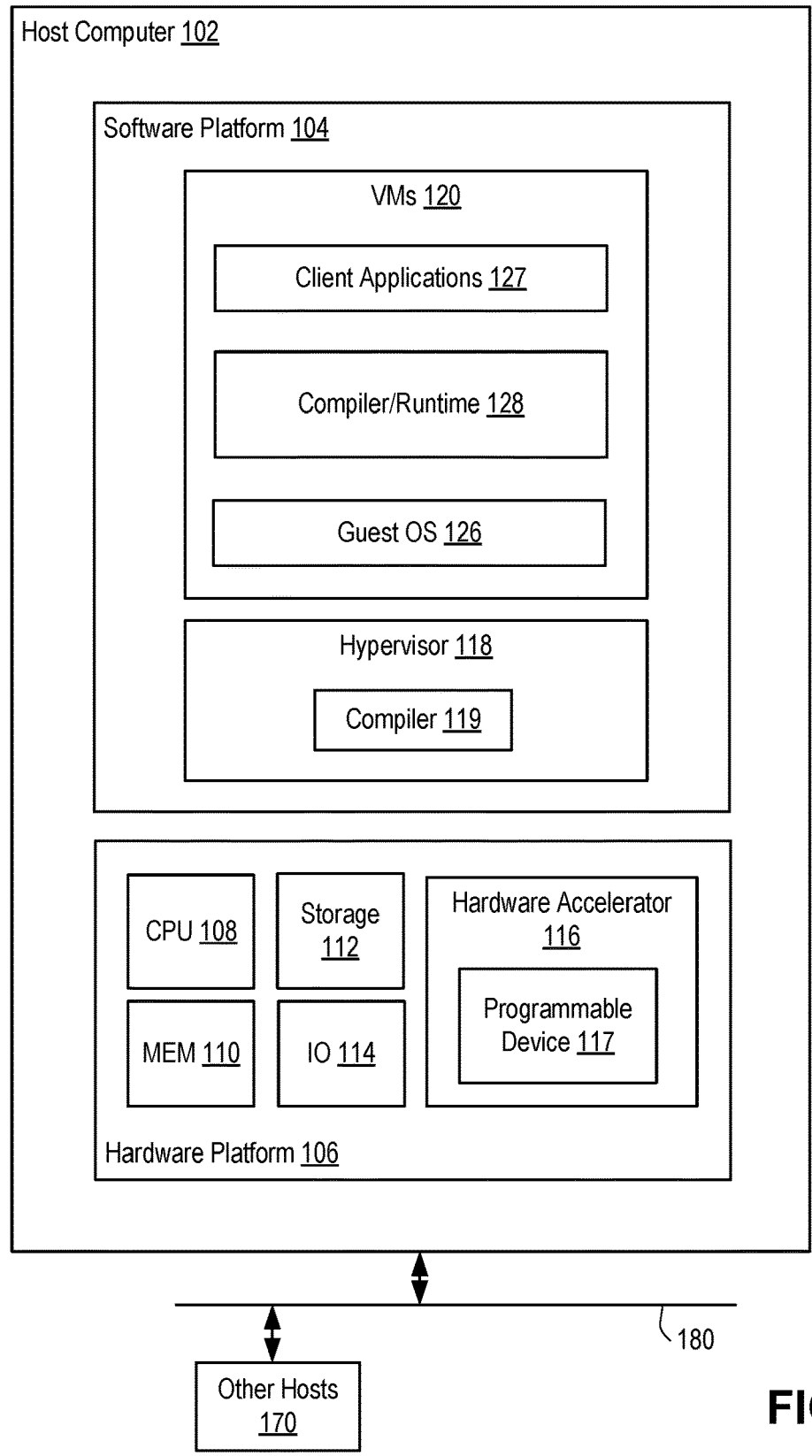
FIG. 1 is a block diagram depicting a virtualized computing system according to an embodiment.

Techniques for compiler-driver programmable device virtualization in a computing system are described. Hardware accelerators with FPGAs are described herein for purposes of example. It is to be understood that other types of programmable devices may be employed in similar fashion. FPGA accelerators combine the functional efficiency of hardware with the programmability of software. FPGAs can exceed the performance of general-purpose central processing units (CPUs) by several orders of magnitude and offer dramatically lower cost and time to market than application specific integrated circuits (ASICs). FPGAs have been embraced with a tentative enthusiasm in the data center, where they promise infrastructure providers the ability to support diverse specialized applications with a single hardware technology. Growing compute density and clock speeds combined with plummeting cost per-logic cell make them a compelling substrate for on-demand reconfigurable hardware acceleration. Heretofore, a standard technique for virtualizing FPGAs has yet to emerge and there has been no widely agreed upon method for workload migration (suspending and resuming the execution of a hardware program, or relocating it from one FPGA to another mid-execution) or multitenancy (spatially or temporally multiplexing multiple hardware programs on a single FPGA). Because virtualization is the core technology that enables cost-effective operation of a data center, this is a serious obstacle to unlocking the potential of FPGAs as a mainstream accelerator technology.

FPGA virtualization is difficult because the state of a hardware program is not readily accessible to the operating system (OS). Software applications keep data structures in memory and a small set of statically known hardware registers. As a result, software virtualization can rely on program-agnostic techniques to save and restore the register file and the contents of virtual memory. In contrast, the state of an FPGA program is distributed throughout its reprogrammable fabric in a program-dependent fashion. The only way to suspend and resume the execution of a program is to access the entire register state of the device. Moreover, without knowing how one program was compiled for an FPGA, there is no way to share the FPGA with a second program or use it as a target for a program which needs to be relocated mid-execution.

One technique for FPGA virtualization is a hardware-based virtualization solution analogous to multi-core CPU architectures. Rather than offer a device with a single large reprogrammable fabric, a hardware-based virtualization technique partitions the device into isolated regions that are exposed to the hypervisor as a set of smaller fabrics. While attractive for its simplicity, this approach suffers from a potential for both internal and external fragmentation. A program can be too large to fit in any one region, even when there are sufficient aggregate resources available to support it, or the device can be occupied by a set of small programs that significantly under-utilize their regions. Worse, the requirement for hardware support makes the approach inapplicable to FPGAs that do not have this capability, which includes the multitude of FPGAs that occupy the data center today.

Techniques described herein implement FPGA virtualization on a hardware accelerator using a combined compiler/runtime environment. In an embodiment, the compiler can be based on Cascade, a just-in-time (JIT) compiler for Verilog®. Cascade is an open source compiler/runtime that allows users to write code one line at a time by hiding the latency of hardware compilation behind a software interpreter. Cascade accomplishes this by using a static analysis to transform the user's code into a distributed-system-like intermediate representation (IR) consisting of monadic sub-programs that can be moved back and forth mid-execution between a software interpreter and native FPGA execution. This is made possible by a set of compiler transformations that produce code that can trap into the Cascade runtime at the end of the logical clock-tick without violating the semantics of the Verilog programming model.

Techniques described herein increase the expressiveness of this transformation. The techniques include transformations that produce code that can be interrupted at the sub-clock-tick granularity. This allows Cascade to support a large new class of unsynthesizable Verilog (language constructs designed to only target simulation) in hardware (the traditional Verilog workflow involves testing and debugging unsynthesizable code in a simulator and compiling and releasing a target specific synthesizable variant of that code). This class contains constructs that can be used to start, stop, and save the state of a program at any point in its execution. These are precisely the runtime primitives necessary to support workload migration without requiring modifications to the Verilog standard or new hardware-specific support, and the overhead they impose on the compiler/runtime flow is negligible.

Techniques described herein further include modifications to the Cascade runtime that enable support for multitenancy. The compiler/runtime assumes ownership of the FPGA and its IR is laid out on a device such that sub-programs share a communication link with the runtime. The described techniques introduce a hypervisor that can combine the sub-program representations for multiple instances of Cascade into a single hardware program whose implementation is kept hidden from those instances. This module is responsible for interleaving asynchronous data and control requests between each of those instances and the FPGA. In contrast to hardware-based approaches, manipulating each instance's state is less complex, as the hypervisor has access to every instance's source and how it is mapped on to the device.

Combined with the transformations described above, this redesign provides a complete compiler-driven strategy for FPGA virtualization.

Techniques described herein further provide a new back-end for the Cascade runtime based on the open source AmorphOS FPGA runtime, which provides OS-level guarantees such as process isolation, fair scheduling, and cross-platform compatibility. A major obstacle to using AmorphOS is the requirement that an application satisfy a quiescence interface (provide signals that report when it can be safely evacuated from the FPGA). The techniques relax this requirement by using the compiler/runtime to identify the set of variables that comprise a program's state and emitting code to force quiescence on demand. For applications that do satisfy this interface, quiescence is used as a source of optimization. In many environments, workload migration takes place on a flexible schedule and migration overhead can be reduced by waiting for a quiescence signal and eliding state-copy altogether. These and further aspects are described below with respect to the drawings.

FIG. 1 is a block diagram depicting a virtualized computing system 100 according to an embodiment. Virtualized computing system 100 includes a host computer 102 having a software platform 104 executing on a hardware platform 106. Hardware platform 106 may include conventional components of a computing device, such as a central processing unit (CPU) 108, system memory (MEM) 110, a storage system (storage) 112, and input/output devices (IO) 114. Hardware platform 106 also includes a hardware accelerator 116 having a programmable device 117 (e.g., an FPGA). CPU 108 is configured to execute instructions, for example, executable instructions that perform one or more operations described herein and may be stored in system memory 110 and storage system 112. System memory 110 is a device allowing information, such as executable instructions, virtual disks, configurations, and other data, to be stored and retrieved. System memory 110 may include, for example, one or more random access memory (RAM) modules. Storage system 112 includes local storage devices (e.g., one or more hard disks, flash memory modules, solid state disks, and optical disks) and/or a storage interface that enables host computer 102 to communicate with one or more network data storage systems. Examples of a storage interface are a host bus adapter (HBA) that couples host computer 102 to one or more storage arrays, such as a storage area network (SAN) or a network-attached storage (NAS), as well as other network data storage systems. Input/output devices 114 include conventional interfaces known in the art, such as one or more network interfaces.

Software platform 104 includes a virtualization layer that abstracts processor, memory, storage, and networking resources of hardware platform 106 into one or more virtual machines ("VMs") that run concurrently on host computer 102. The VMs run on top of the virtualization layer, referred to herein as a hypervisor, which enables sharing of the hardware resources by the VMs. In the example shown, software platform 104 includes a hypervisor 118 that supports VMs 120. One example of hypervisor 118 that may be used in an embodiment described herein is a VMware ESXi™ hypervisor provided as part of the VMware vSphere® solution made commercially available from VMware, Inc. of Palo Alto, Calif. (although it should be recognized that any other virtualization technologies, including Xen® and Microsoft Hyper-V® virtualization technologies may be utilized consistent with the teachings herein). Hypervisor 118 includes a compiler 119, which is described further below.

Each VM 120 includes guest software (also referred to as guest code) that runs on the virtualized resources supported by hardware platform 106. In the example shown, the guest software of VM 120 includes a guest OS 126, a compiler/runtime 128, and client applications 127. Guest OS 126 can be any commodity operating system known in the art (e.g., Linux®, Windows®, etc.). Client applications 127 can be any applications executing on guest OS 126 within VM 120. Compiler/runtime 128 is discussed further below.

Compiler/runtime 128 receives hardware description language (HDL) specifications of circuits as input. Compiler/runtime 128 cooperates with compiler 119 to implement a circuit in a programmable device 117 based on the specifications. In embodiments, compiler 119 communicates with multiple instances of compiler/runtime 128 in multiple VMs 120. Compiler 119 implements a single circuit for programmable device 117 that includes sub-circuits for each compiler/runtime 128. Aspects of multi-tenancy are described further below.

Example HDLs include Verilog and VHDL. By way of example, Verilog includes synthesizable and unsynthesizable constructs. Synthesizable Verilog describes computation that can be lowered onto an FPGA, while unsynthesizable Verilog includes tasks such as print statements that increase the expressive power of the language and improve debugability, but whose implementation requires interaction with software. Verilog programs are declarative, and organized hierarchically in units called modules. An example of a Verilog module is shown below:

```
1: module Module(
2: input wire clock,
3: output wire[31:0] res
4: );
5: wire[31:0] x = 1, y = x + 1;
6: reg[63:0] r = 0;
7: SubModule sm(clock);
8:
9: always @(posedge clock) begin
10: $display(r); // Prints 0,3,3,...
11: r = y;
12: $display(r); // Prints ?,2,2,...
13: r <= 3;
14: $display(r); // Prints ?,2,2,...
15: end
16:
17: always @(posedge clock) fork
18: $display(r); // Prints ?,?,?,...
19: join
20:
21: assign res = r[47:16] & 32'hf0f0f0f0;
22: endmodule
```

The interface to a module is defined in terms of its input/output ports (clock, res), and its semantics are defined in terms of arbitrary width wires (x,y) and registers (r), logic gates (e.g. &), primitive arithmetic (e.g. +), and nested sub-modules (sin). The connections to the root (top-most) module in a Verilog program correspond to IO peripherals (e.g. a DIP switch, or a clock). A module may access these, or variables in another part of the hierarchy, through a series of input/output connections. Notably, there is no way to dynamically instantiate modules, storage, or connections. Every variable in a Verilog program can be named through a tractable static analysis at compile time. Verilog supports both stateless and stateful variables. The value of a stateless variable is functionally determined by its inputs (lines 5, 21), whereas the value of a stateful variable can be updated at discrete intervals (lines 6, 11, 13). For simplicity, this discussion ignores Verilog's rules of type inference (reg may be demoted to wire) and assumes variables declared reg are stateful, while variables declared wire are stateless. The extensions to Cascade in embodiments described herein do not require this and are sound with respect to the Verilog standard. Verilog also supports a mix of sequential and concurrent semantics. Continuous assignments (lines 5, 21) are scheduled when the value of their right-hand-side changes, whereas procedural blocks (lines 9-19) are scheduled when their guard is satisfied (e.g. clock changes from 0 to 1). The ordering of these events is undefined, and their evaluation is non-atomic. Further, any of the statements in a fork/join block may be evaluated in any order. Only a begin/end block is guaranteed to be evaluated sequentially. Procedural blocks can contain two types of assignments to stateful variables: blocking (=) and non-blocking (<=). Blocking assignments are executed immediately, whereas non-blocking assignments are executed when there are no continuous assignments or control blocks left to schedule. When used idiomatically, these semantics are intuitive: stateless variables appear to change value instantly and stateful variables appear to change value on the clock tick. However the use of unsynthesizable print statements in procedural blocks reveals a more complicated interaction. The print statement on line 18 is non-deterministic, as it can be interleaved with any of the assignments on lines 10-14. The first execution of lines 12 and 14 are non-deterministic as well, as they can be interleaved with the assignment on line 5. While the assignment on line 11 is visible immediately, the assignment on line 13 is only performed after every block and assignment has been scheduled, thus the value 3 only appears the second time that line 10 is executed.

In an embodiment, compiler/runtime 128 is based on Cascade, which is a JIT compiler for Verilog. Cascade's user interface is a Read-Eval-Print-Loop (REPL) similar to a Python interpreter. Verilog is lexed, parsed, and type-checked one line at a time. Code that passes these checks is integrated into the user's program and its side effects become visible immediately. Crucially, these can include the results of executing unsynthesizable Verilog. Cascade accomplishes this by applying transformations to the user's program that produce code that can trap into the Cascade runtime at the end of the logical clock tick. These traps are used to handle unsynthesizable statements in a way that is consistent with the scheduling semantics of Verilog whether they originate from software simulation or hardware execution. Cascade uses the syntax of Verilog to manage programs at the module granularity. Cascade's IR expresses a distributed system composed of Verilog sub-programs, each of which correspond to a single module in the user's program. The runtime state of a sub-program is represented by a data structure known as an engine. Subprograms start as low-performance, software-simulated engines and are replaced over time by high-performance FPGA-resident engines. Cascade retains the flexibility to relocate engines by imposing a constrained application binary interface (ABI) on its IR, mediated by messages sent over the runtime's data/control plane.

Relevant to techniques described herein is a subset of that ABI: get/set and evaluate/update messages. The get/set messages read and write an engine's inputs, outputs, and stateful variables. The evaluate/update messages are used to request that an engine run until no more continuous assigns or procedural blocks can be scheduled, and latch the result of non-blocking assignments, respectively. Requests to eval code, and execute unsynthesizable statements, are placed on an ordered interrupt queue, and a scheduler is used to orchestrate program execution via get/set and evaluate/ update messages. Interrupts are evaluated in between clock ticks, when changes to engine state have reached a fixed-point, and the program is in a consistent state. For this reason, Cascade's support for unsynthesizable Verilog is output-only. For example, print statements can occur at arbitrary points during program execution, but their side effects are only made visible between clock-ticks. Currently, there is no way to schedule an interrupt between the statements in a begin/end block, block on the result, and continue execution.

Figure 2:
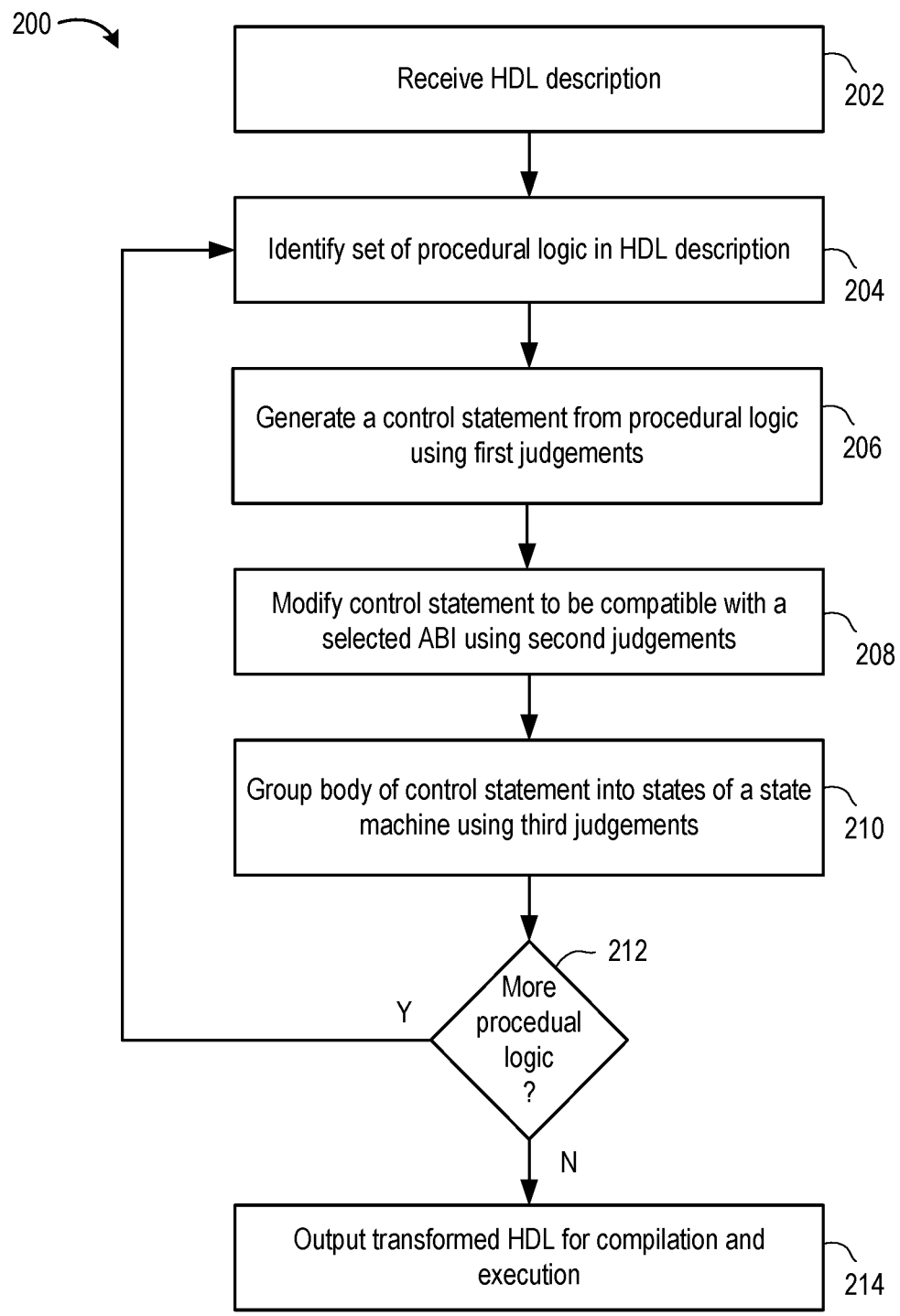
FIG. 2 is a flow diagram depicting a method of transforming an HDL description to provide control at a sub-clock-tick granularity according to an embodiment.

FIG. 2 is a flow diagram depicting a method 200 of transforming an HDL description to provide control at a sub-clock-tick granularity according to an embodiment. Method 200 can be performed by compiler/runtime 128. This transformation allows Cascade to support the entire unsynthesizable Verilog standard from hardware, including $save and $restart, the two primitives that are necessary for supporting workload migration. The example described herein frames this discussion a file IO example. While file IO is not necessary for virtualization, it provides a clear perspective from which to understand the transformation.

Consider the program shown below, which uses unsynthesizable IO tasks to sum the values contained in a large file.

```
1: module M(
2: input wire clock
3: );
4: integer fd = $fopen("path/to/file");
5 reg[31:0] r = 0;
6: reg[127:0] sum = 0;
7
8: always @(posedge clock) begin
9: $fread(fd, r); // TASK 1
10: if ($feof(fd)) // FEOF 1
11: $display(sum); // TASK 2
12: $finish(0); // TASK 3
13: else
14: sum <= sum + r;
15: end
16: endmodule
```

The program opens the file (line 4) and on every clock tick, attempts to read a 32-bit value (line 9). When the program reaches the end-of-file, it prints the running sum and returns control to the host (lines 10-12). Otherwise, it adds the value to the running sum and continues (line 14). While this program is simple, its structure is typical of applications that perform streaming computation over large data-sets. Adding support for these tasks would greatly increase the set of programming idioms that Cascade could support. The key obstacle to supporting this program is that the IO tasks introduce data-dependencies within a single clock-tick. The end-of-file check on line 10 depends on the result of the read operation on line 9, as does the assignment on line 14. Because the semantics of these operations involve an interaction with the file system, we must not only pause the execution of the program mid-cycle while control is transferred to the host, but also block for an arbitrary amount of time until the host produces a result. The solution is to transform the program into a state machine which implements a co-routine style semantics. While a programmer could certainly adopt this idiom to begin with, the necessary modifications would negatively impact both readability and maintainability and are unlikely to be worth the investment.

Method 200 begins at step 202, where compiler/runtime 128 receives an HDL description input by a user. At step 204, compiler/runtime 128 parses the HDL description to identify a set of procedural logic. At step 206, compiler/runtime 128 generates a control statement from the procedural logic using first transformations. FIG. 3A depicts a set of first transformations according to an embodiment. The first transformations establish the invariant that all procedural logic appears in a single control statement. Intuitively, these transformations rely of the semantics of Verilog being lax about the relative scheduling of ungrouped statements. Note that any fork/join block may be replaced by an equivalent begin/end block, as the sequential semantics of the latter are a valid scheduling of the former. Additionally, any nested set of begin/end blocks may be flattened into a single block as there are no scheduling constraints implied by nested blocks. Next, step 204 creates procedural control statement (the core) that is guarded by the union of the events that guard each individual statement. This is sound, as Verilog only allows disjunctive guards. Additionally, step 204 sets the body of the core to a new begin/end block containing the conjunction of the bodies of each individual block. This is sound as well, as sequential execution is a valid scheduling of active procedural control statements. Finally, step 204 guards each conjunct with a name-mangled version of its original guard (e.g. _pos_x, details below) as all of the conjuncts would otherwise be executed when the core is triggered.

At step 206, compiler/runtime 128 modifies the control statement to be compatible with a selected ABI using second transformations. In an embodiment, the selected ABI is the Cascade ABI. During step 206, the compiler/runtime 128 uses second transformations as shown in FIG. 3B to modify the control structure of the core so that it is compatible with Cascade's ABI. All of the inputs to an IR sub-program including the clock will be presented as values contained in set messages which may be separated by many native clock cycles on the target device. To account for this, step 206 declares state to hold the previous values of variables that appear in the core's guard, and wires that capture their semantics in the original program (e.g. _pos_x is true whenever a set message last changed x from false to true. Step 206 also declares new variables (_state and _task) to track the control state of the core, and whether a system task requires the attention of the runtime. Finally, step 206 replaces the core's guard by a posedge trigger for the native clock on the target device (_clk).

At step 208, compiler/runtime 128 groups the body of the control statement into states of a state machine using third transformations. FIG. 3C shows an embodiment of the third transformations used in step 208. Using the third transformations, the compiler/runtime 128 groups the body of the core into states in a state machine. The standard list-builder notation s; S refers to the statements in its body, s to a synthesizable statement, and τ to an unsynthesizable statement. For brevity, transitions from the return value of M are omitted. States includes as many synthesizable statements as possible and are terminated either by unsynthesizable tasks or the guard of an if or case statement. A new state is created for each branch of a conditional statement, and a phi node is used to rejoin control flow. A Cascade backend has flexibility in how it chooses to lower the resulting state machine onto Verilog text. An example transformation of an HDL description is shown below:

```
1: module M(
2: input wire ___clk,
```

```
 3: input wire[5:0] ___abi
 4: );
 5: reg ___pclock;
 6: always @(posedge___clk)
 7: ___pclock <= clock;
 8: wire ___pos_clock = !___pclock & clock;
 9:
10: reg[31:0] ___state = 5;
11: reg[31:0] ___task = 'NONE;
12: always @(posedge ___clk)
13: if (___pos_clock)
14: {___task,___state} = {'TASK_1, 1};
15: if ((___state == 1) && ___cont)
16: ___task = 'NONE;
17: ___state = ___feof1 ? 2 : 4;
18: if ((___state == 2) && ___cont)
19: {___task,___state} = {'TASK_2, 3};
20: if ((___state == 3) && ___cont)
21: {___task,___state} = {'TASK_3, 5};
22: if ((___state == 4) && ___cont)
23: ___sum_next <= sum + r;
24: {___task,___state} = {'NONE, 5};
25: if ((___state == 5) && ___cont)
26: {___task,___state} = {'NONE, 5};
27:
28: wire ___tasks = ___task != 'NONE;
29: wire ___final = ___state == 5;
30: wire ___cont = (___abi == 'CONT) |
31: (!___final & !___tasks);
32: wire ___done = ___final & !___tasks;
33: endmodule
```

In the example, each state can be materialized as an if statement which performs the logic associated with the state, takes a transition, and sets the _task register if the state ended in an unsynthesizable statement. Control enters the first state when the variable associated with the original guard (_pos_clock) evaluates to true and continues via the fall-through semantics of Verilog until a task is triggered. When this happens, the Cascade runtime takes control, place its results (if any) in the appropriate hardware location, and yields back to the target device by asserting the _cont signal. When control enters the final state, the program asserts the _done signal, indicating that there is no further work to do be done. Collectively, these steps represent the compute portion of the evaluate, update, and open_loop requests required by the Cascade ABI.

At step 212, compiler/runtime 128 determines if more procedural logic is to be transformed. If so, method 200 returns to step 204 and repeats. Otherwise, method 200 proceeds to step 214, where compiler/runtime 128 outputs the transformed HDL for compilation and execution.

Having implemented the transformations described in the example above, support for the $save and $restart system tasks is straightforward. Both are materialized as traps triggered by the value of _task in the Cascade runtime. The former prompts the runtime to save the state of the program through a series of get requests, and the latter prompts a sequence of set requests. Either statement can be triggered in the course of normal program execution, or via an eval statement passed to the Cascade runtime via user interaction. Once a program's state is read out, it can be suspended, migrated to another physical machine if necessary, and resumed as the virtualization environment requires.

Figure 4:
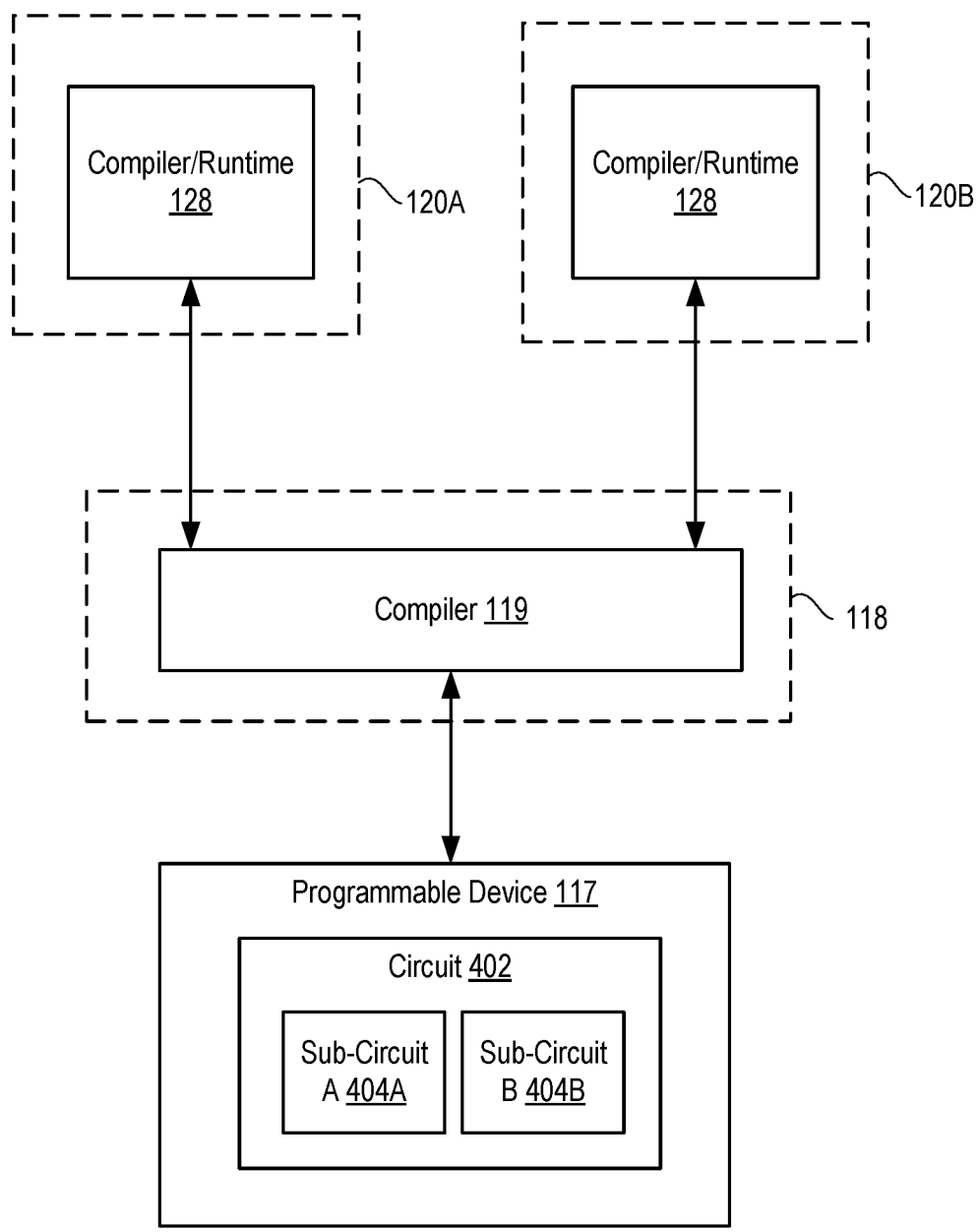
FIG. 4 is a block diagram depicting a logical view of a circuit implementation process in a virtualized computing system with a hardware accelerator according to an embodiment.

FIG. 4 is a block diagram depicting a logical view of a circuit implementation process in a virtualized computing system with a hardware accelerator according to an embodiment. In the example shown, hypervisor 118 supports two VMs 120A and 120B, each executing an instance of compiler/runtime 128 (e.g., Cascade). Hypervisor 118 executes a compiler 119, which functions as described below to implement a circuit 402 in programmable device 117. Circuit 402 includes one or more sub-circuits A 404A generated from HDL description provided by compiler/runtime 128 in VM 120A, and one or more sub-circuits B 404B generated from HDL description provided by compiler/runtime 128 in VM 120B.

In an embodiment, each compiler/runtime 128 establishes a network connection with compiler 119, which can be configured to run on a known port. Each compiler/runtime 128 sends the source code for a sub-program over the connection. Compiler 119 proceeds with compilation of each sub-program and concludes with a target-specific implementation of a circuit 402 placed on the programmable device 117. Circuit 402 includes sub-circuit(s) 404A for the sub-program from VM 120A and sub-circuit(s) 404B from the sub-program from VM 120B. Compiler 119 then responds to each compiler/runtime 128 with a unique identifier which can be used to remotely identify respective sub-circuits 404. Upon receipt, compiler/runtime 128 creates an engine for a respective sub-circuit that remains permanently in software, and is configured with the unique identifier contained in the reply. The resulting engine interacts with compiler/runtime 128 as usual. However, its implementation of the Cascade ABI is simply to forward requests across the network to compiler 119, and block further execution until a reply is obtained. Compiler 119 has access to the source code for every sub-program. This allows compiler 119 to support multitenancy by combining the source code for each sub-program into a single monolithic program (e.g., implemented as circuit 402). Whenever the text of a sub-program changes, compiler 119 recompiles the entire combined program to support the new logic. Whenever a compiler/runtime 128 finishes its execution, all of its sub-programs are removed from the combined program and compiler 119 recompiles and reimplements circuit 402. In embodiments, compiler 119 concatenates the text of the sub-programs and uses the unique identifier to route ABI requests. While the present example presents a compiler 119 that compiles all of its sub-programs to one programmable device 117, there is no reason why this need by the case. In other embodiments, compiler 119 can delegate the compilation of a sub-program to a second hypervisor in another host, e.g., if there is no space left on the programmable device 117.

In embodiments, compiler 119 schedules ABI requests sequentially to avoid resource contention. The one exception to this rule is compilation, which can take a very long time to run to completion. If compilation were serialized in between ABI requests, it could render connected instances of compiler/runtime 128 non-interactive. But scheduling compilation asynchronously leads to a key implementation challenge: compilation is potentially destructive. Changing the text of one Cascade instance's sub-program's requires that the entire programmable device 117 be reprogrammed, a process which would destroy both that instance and any other connected instance's state. In embodiments, compiler 119 achieves a solution by scheduling these destructive events when all connected instances of compiler/runtime 128 are in between logical clock-ticks and have evacuated their state.

A handshake protocol can be used to establish these invariants. When compiler 119 receives a compilation request, it is scheduled asynchronously and run until it would do something destructive. Compiler 119 then sends a request to every connected instance of compiler/runtime 128 to schedule an interrupt in between their logic clock-ticks when they are in a consistent state. The interrupt causes the instances 128 to send get requests to compiler 119 to evacuate their state. When they have finished, the instances send a reply indicating it is safe to reprogram the programmable device 117 and block until they receive an acknowledgement from compiler 119. Compilation proceeds after the final reply. The programmable device 117 is reprogrammed and the handshake finishes in the opposite fashion. Compiler 119 informs the instances 128 it is finished, they send set requests to replace their state on the target programmable device 117 and control proceeds as normal. As Cascade sub-programs are monadic by construction, this process preserves soundness.

Collectively, the above-described extensions to Cascade provide a platform for supporting multitenancy. Spatial multiplexing is accomplished by combining the sub-programs from each connected instance of compiler/runtime 128 into a single monolithic program on the target device, and temporal multiplexing is accomplished by serializing ABI requests which require the use of an IO resource (e.g., a connection to an in-memory dataset) that is in use by another sub-program. The various methods described above are illustrated below with respect to the following flow diagrams of FIGS. 5-8.

Figure 5:
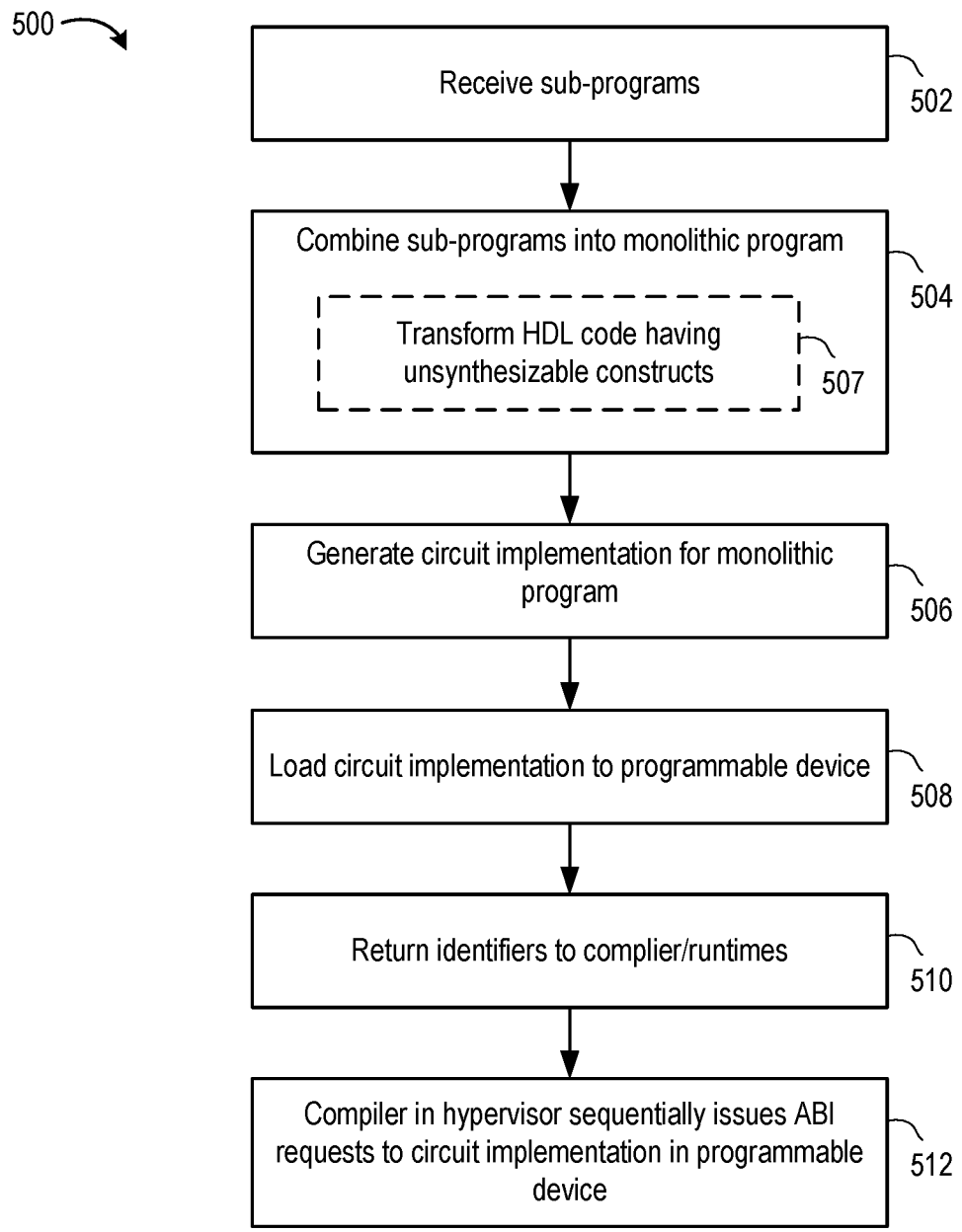
FIG. 5 is a flow diagram depicting a method of virtualizing a hardware accelerator in a virtualized computing system according to an embodiment.

FIG. 5 is a flow diagram depicting a method 500 of virtualizing a hardware accelerator in a virtualized computing system according to an embodiment. Method 500 begins at step 502, where compiler 119 receives sub-programs from compiler/runtimes 128. At step 504, compiler 119 combines the sub-programs into a monolithic program. In some embodiments, compiler 119 transforms HDL code having unsynthesizable constructs as described above with respect to FIG. 2. In other embodiments, each compiler/runtime 128 can transform the HDL code prior to sending the sub-programs to compiler 119. At step 506, compiler 119 generates a circuit implementation for the monolithic program. For example, compiler 119 can synthesize the HDL code of the monolithic program and then map, place and route the synthesized logic onto the programmable fabric of the device to generate a bitstream for loading to the device. At step 508, compiler 119 loads the circuit implementation to the programmable device (e.g., by loading the bitstream to the device). At step 510, compiler 119 returns identifiers to compiler/runtimes 128 for use in servicing ABI requests, as discussed below. At step 512, compiler 119 sequentially issues ABI requests from all compiler/runtimes 128 to the circuit implementation in the programmable device 117. ABI requests can include, for example, get/set requests, evaluate/update requests, or the like.

Figure 6:
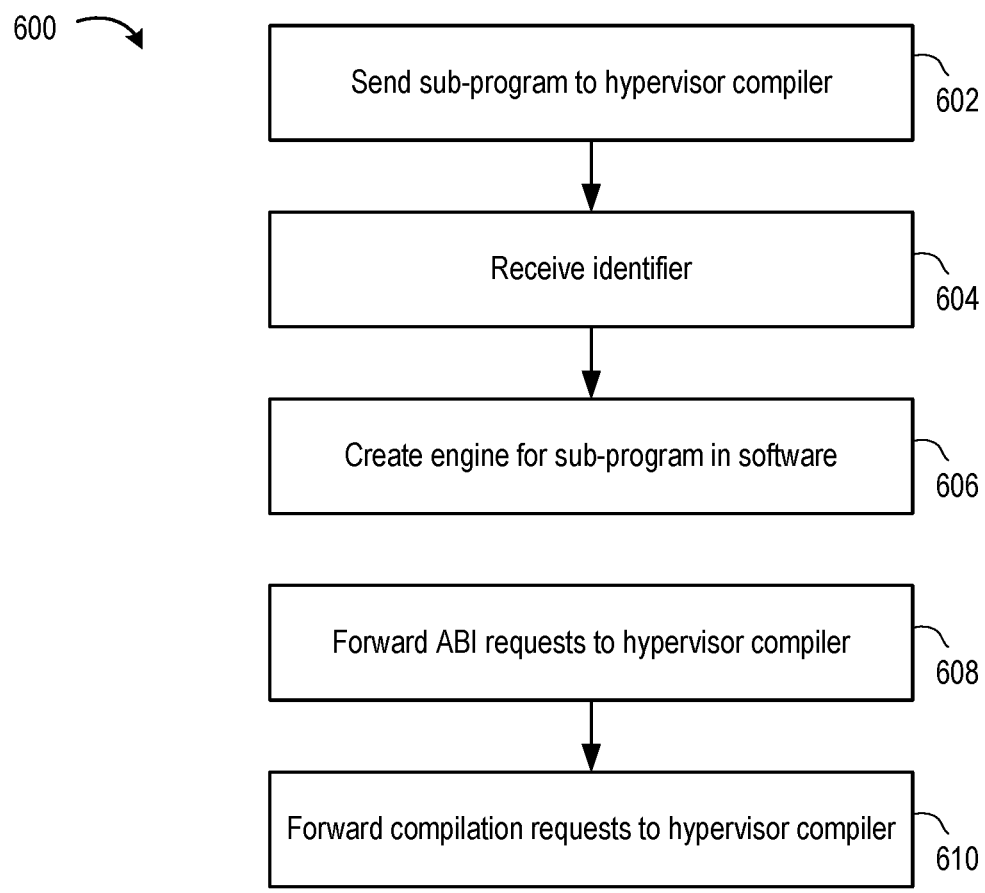
FIG. 6 is a flow diagram depicting a method of implementing and executing a sub-program at a compiler/runtime according to an embodiment.

FIG. 6 is a flow diagram depicting a method 600 of implementing and executing a sub-program at a compiler/runtime 128 according to an embodiment. Method 600 begins at step 602, where compiler/runtime 128 sends a sub-program to compiler 119 (as discussed above in FIG. 5). At step 604, compiler/runtime 128 receives an identifier from compiler 119. At step 606, compiler/runtime 128 creates an engine for the sub-program in software. At step 608, compiler/runtime 128 forwards one or more ABI requests to compiler 119. ABI requests can include, for example, get/set requests, evaluate/update requests, or the like. At step 610, compiler/runtime 128 can forward one or more compilation requests to compiler 119. Compiler 119 can perform recompilation and reimplementation as described below.

Figure 7:
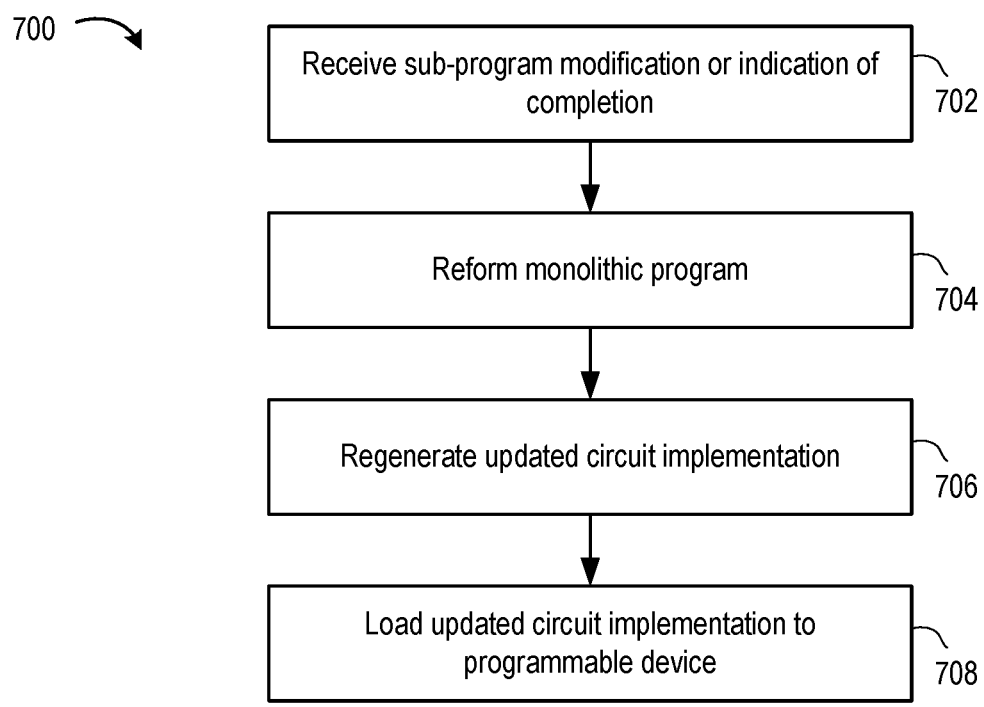
FIG. 7 is a flow diagram depicting a method of processing a modification to a sub-program at a hypervisor compiler according to an embodiment.

FIG. 7 is a flow diagram depicting a method 700 of processing a modification to a sub-program at compiler 119 according to an embodiment. Method 700 begins at step 702, where compiler 119 receives a sub-program modification or an indication of completion from a compiler/runtime 128. At step 704, compiler 119 reforms the monolithic program either having the modification to the sub-program or with the sub-program removed in case of completion. At step 706, compiler 119 regenerates an updated circuit implementation for the programmable device based on the updated monolithic program. At step 708, compiler 119 loads the updated circuit implementation to the programmable device 117.

Figure 8:
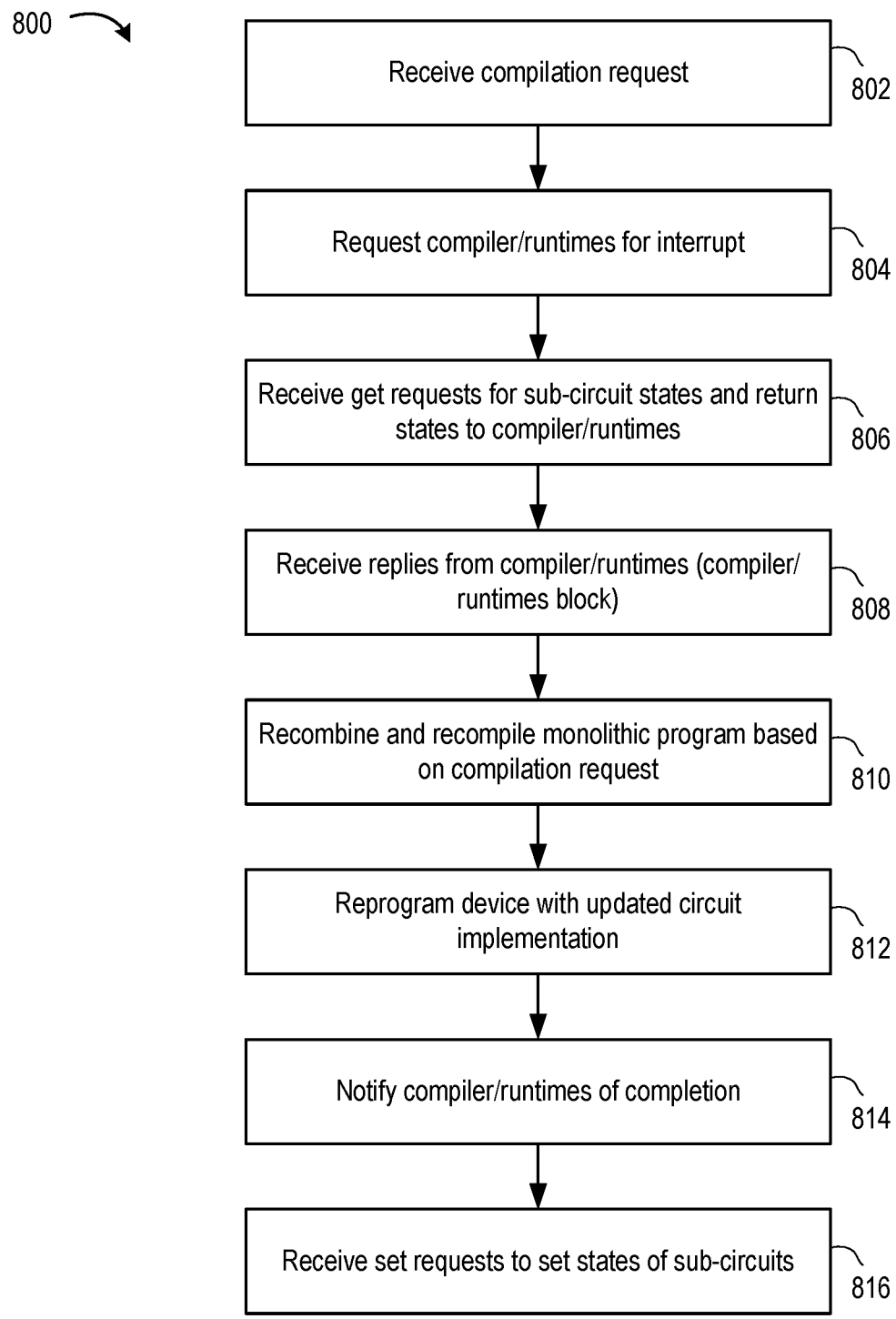
FIG. 8 is a flow diagram depicting a method of handling a compilation request from a compiler/runtime at the hypervisor compiler according to an embodiment.

FIG. 8 is a flow diagram depicting a method 800 of handling a compilation request from a compiler/runtime at the hypervisor compiler according to an embodiment. Method 800 begins at step 802, where compiler 119 receives a compilation request from a compiler/runtime 128 (e.g., a JIT compilation request). At step 804, compiler 119 requests each compiler/runtime 128 for an interrupt. At step 806, compiler 119 receives get requests for sub-circuit states and returns the states to the respective compiler/runtimes 128. This allows compiler/runtimes 128 to save sub-circuit states during the recompilation process.

At step 808, compiler 119 receives replies from compiler/runtimes 128 indicating the states have been saved. Compiler/runtimes 128 block execution during the recompilation process. At step 810, compiler 119 recombines and recompiles the monolithic program based on the compilation request. At step 812, compiler 119 reprograms the device with an updated circuit implementation. At step 814, compiler 119 notifies compiler/runtimes 128 of completion of the recompilation process. At step 816, compiler 119 receives set requests from compiler/runtimes 128 to set the states of the sub-circuits in the programmable device having the updated circuit implementation.

The various embodiments described herein may employ various computer-implemented operations involving data stored in computer systems. For example, these operations may require physical manipulation of physical quantities-usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more embodiments of the invention may be useful machine operations. In addition, one or more embodiments of the invention also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The various embodiments described herein may be practiced with other computer system configurations including hand-held devices, microprocessor systems, microprocessor-based or programmable consumer electronics, minicomputers, mainframe computers, and the like.

One or more embodiments of the present invention may be implemented as one or more computer programs or as one or more computer program modules embodied in one or more computer readable media. The term computer readable medium refers to any data storage device that can store data which can thereafter be input to a computer system-computer readable media may be based on any existing or subsequently developed technology for embodying computer programs in a manner that enables them to be read by a computer. Examples of a computer readable medium include a hard drive, network attached storage (NAS), read-only memory, random-access memory (e.g., a flash memory device), a CD (Compact Discs)—CD-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

Although one or more embodiments of the present invention have been described in some detail for clarity of understanding, it will be apparent that certain changes and modifications may be made within the scope of the claims. Accordingly, the described embodiments are to be considered as illustrative and not restrictive, and the scope of the claims is not to be limited to details given herein, but may be modified within the scope and equivalents of the claims. In the claims, elements and/or steps do not imply any particular order of operation, unless explicitly stated in the claims.

Virtualization systems in accordance with the various embodiments may be implemented as hosted embodiments, non-hosted embodiments or as embodiments that tend to blur distinctions between the two, are all envisioned. Furthermore, various virtualization operations may be wholly or partially implemented in hardware. For example, a hardware implementation may employ a look-up table for modification of storage access requests to secure non-disk data.

Certain embodiments as described above involve a hardware abstraction layer on top of a host computer. The hardware abstraction layer allows multiple contexts to share the hardware resource. In one embodiment, these contexts are isolated from each other, each having at least a user application running therein. The hardware abstraction layer thus provides benefits of resource isolation and allocation among the contexts. In the foregoing embodiments, virtual machines are used as an example for the contexts and hypervisors as an example for the hardware abstraction layer. As described above, each virtual machine includes a guest operating system in which at least one application runs. It should be noted that these embodiments may also apply to other examples of contexts, such as containers not including a guest operating system, referred to herein as "OS-less containers" (see, e.g., www.docker.com). OS-less containers implement operating system-level virtualization, wherein an abstraction layer is provided on top of the kernel of an operating system on a host computer. The abstraction layer supports multiple OS-less containers each including an application and its dependencies. Each OS-less container runs as an isolated process in userspace on the host operating system and shares the kernel with other containers. The OS-less container relies on the kernel's functionality to make use of resource isolation (CPU, memory, block I/O, network, etc.) and separate namespaces and to completely isolate the application's view of the operating environments. By using OS-less containers, resources can be isolated, services restricted, and processes provisioned to have a private view of the operating system with their own process ID space, file system structure, and network interfaces. Multiple containers can share the same kernel, but each container can be constrained to only use a defined amount of resources such as CPU, memory and I/O. The term "virtualized computing instance" as used herein is meant to encompass both VMs and OS-less containers.

Many variations, modifications, additions, and improvements are possible, regardless the degree of virtualization. The virtualization software can therefore include components of a host, console, or guest operating system that performs virtualization functions. Plural instances may be provided for components, operations or structures described herein as a single instance. Boundaries between various components, operations and data stores are somewhat arbitrary, and particular operations are illustrated in the context of specific illustrative configurations. Other allocations of functionality are envisioned and may fall within the scope of the invention(s). In general, structures and functionality presented as separate components in exemplary configurations may be implemented as a combined structure or component. Similarly, structures and functionality presented as a single component may be implemented as separate components. These and other variations, modifications, additions, and improvements may fall within the scope of the appended claim(s).

We claim:

1. A method of virtualizing a hardware accelerator in a virtualized computing system, the virtualized computing system including a hypervisor supporting execution of a plurality of virtual machines (VMs), the method comprising:
   receiving a plurality of sub-programs at a compiler in the hypervisor from a plurality of compilers in the respective plurality of VMs, each of the sub-programs including a hardware-description language (HDL) description;
   combining, at the compiler in the hypervisor, the plurality of sub-programs into a monolithic program;
   generating, by the compiler in the hypervisor, a circuit implementation for the monolithic program, the circuit implementation including a plurality of sub-circuits for the respective plurality of sub-programs; and
   loading, by the compiler in the hypervisor, the circuit implementation to a programmable device of the hardware accelerator.

2. The method of claim 1, further comprising:
   receiving, at the compiler in the hypervisor, an update to a first sub-program of the plurality of sub-programs from a first compiler of the plurality of compilers;
   combining, at the compiler in the hypervisor, the plurality of sub-programs having the update to the first sub-program into an updated monolithic program;
   generating, by the compiler in the hypervisor, an updated circuit implementation for the updated monolithic program; and
   loading, by the compiler in the hypervisor, the updated circuit implementation to the programmable device.

3. The method of claim 1, further comprising:
   receiving, at the compiler in the hypervisor, a completion indication from a first compiler of the plurality of compilers;
   combining, at the compiler in the hypervisor, the plurality of sub-programs other than a first sub-program received from the first compiler into an updated monolithic program;
   generating, by the compiler in the hypervisor, an updated circuit implementation for updated monolithic program; and
   loading, by the compiler in the hypervisor, the updated circuit implementation to the programmable device.

4. The method of claim 1, wherein the step of generating comprises:
generating, by the compiler in the hypervisor, a control statement from procedural logic in the monolithic program using a first set of transformations;
modifying, by the compiler in the hypervisor, the control statement to be compatible with a selected application binary interface (ABI) using a second set of transformations; and
grouping, by the compiler in the hypervisor, a body of the control statement into states of a state machine using a third set of transformations.

5. The method of claim 4, wherein the procedural logic includes unsynthesizable HDL code.

6. The method of claim 1, further comprising:
receiving, at the compiler in the hypervisor, application binary interface (ABI) requests from the plurality of compilers; and
scheduling, by the compiler in the hypervisor, the ABI requests to the circuit implementation sequentially.

7. The method of claim 1, further comprising:
receiving, at the compiler in the hypervisor, a compilation request from a first compiler of the plurality of compilers;
requesting, by the compiler in the hypervisor to the plurality of compilers, an interrupt;
receiving, at the compiler from the plurality of compilers in response to the interrupt, requests for states of the plurality of sub-circuits in the circuit implementation;
modifying, by the compiler in the hypervisor, the monolithic program based on the compilation request and loading an updated circuit implementation to the programmable device; and
receiving, at the compiler from the plurality of compilers, requests to restore states of the plurality of sub-circuits in the updated circuit implementation.

8. A non-transitory computer readable medium having instructions stored thereon that when executed by a processor cause the processor to perform a method of virtualizing a hardware accelerator in a virtualized computing system, the virtualized computing system including a hypervisor supporting execution of a plurality of virtual machines (VMs), the method comprising:
receiving a plurality of sub-programs at a compiler in the hypervisor from a plurality of compilers in the respective plurality of VMs, each of the sub-programs including a hardware-description language (HDL) description;
combining, at the compiler in the hypervisor, the plurality of sub-programs into a monolithic program;
generating, by the compiler in the hypervisor, a circuit implementation for the monolithic program, the circuit implementation including a plurality of sub-circuits for the respective plurality of sub-programs; and
loading, by the compiler in the hypervisor, the circuit implementation to a programmable device of the hardware accelerator.

9. The non-transitory computer readable medium of claim 8, further comprising:
receiving, at the compiler in the hypervisor, an update to a first sub-program of the plurality of sub-programs from a first compiler of the plurality of compilers;
combining, at the compiler in the hypervisor, the plurality of sub-programs having the update to the first sub-program into an updated monolithic program;
generating, by the compiler in the hypervisor, an updated circuit implementation for the updated monolithic program; and
loading, by the compiler in the hypervisor, the updated circuit implementation to the programmable device.

10. The non-transitory computer readable medium of claim 8, further comprising:
receiving, at the compiler in the hypervisor, a completion indication from a first compiler of the plurality of compilers;
combining, at the compiler in the hypervisor, the plurality of sub-programs other than a first sub-program received from the first compiler into an updated monolithic program;
generating, by the compiler in the hypervisor, an updated circuit implementation for updated monolithic program; and
loading, by the compiler in the hypervisor, the updated circuit implementation to the programmable device.

11. The non-transitory computer readable medium of claim 8, wherein the step of generating comprises:
generating, by the compiler in the hypervisor, a control statement from procedural logic in the monolithic program using a first set of transformations;
modifying, by the compiler in the hypervisor, the control statement to be compatible with a selected application binary interface (ABI) using a second set of transformations; and
grouping, by the compiler in the hypervisor, a body of the control statement into states of a state machine using a third set of transformations.

12. The non-transitory computer readable medium of claim 11, wherein the procedural logic includes unsynthesizable HDL code.

13. The non-transitory computer readable medium of claim 8, further comprising:
receiving, at the compiler in the hypervisor, application binary interface (ABI) requests from the plurality of compilers; and
scheduling, by the compiler in the hypervisor, the ABI requests to the circuit implementation sequentially.

14. The non-transitory computer readable medium of claim 8, further comprising:
receiving, at the compiler in the hypervisor, a compilation request from a first compiler of the plurality of compilers;
requesting, by the compiler in the hypervisor to the plurality of compilers, an interrupt;
receiving, at the compiler from the plurality of compilers in response to the interrupt, requests for states of the plurality of sub-circuits in the circuit implementation;
modifying, by the compiler in the hypervisor, the monolithic program based on the compilation request and loading an updated circuit implementation to the programmable device; and
receiving, at the compiler from the plurality of compilers, requests to restore states of the plurality of sub-circuits in the updated circuit implementation.

15. A virtualized computing system, comprising:
a hardware platform including a processor, a memory, and a hardware accelerator having a programmable device; and
a software platform having instructions stored in the memory and executing on the processor of the hardware platform, the software platform including a hypervisor supporting execution of a plurality of virtual machines (VMs), the software platform configured to:

receive a plurality of sub-programs at a compiler in the hypervisor from a plurality of compilers in the respective plurality of VMs, each of the sub-programs including a hardware-description language (HDL) description;

combine, at the compiler in the hypervisor, the plurality of sub-programs into a monolithic program;

generate, by the compiler in the hypervisor, a circuit implementation for the monolithic program, the circuit implementation including a plurality of sub-circuits for the respective plurality of sub-programs; and load, by the compiler in the hypervisor, the circuit implementation to a programmable device of the hardware accelerator.

16. The virtualized computing system of claim 15, wherein the software platform is configured to:

receive, at the compiler in the hypervisor, an update to a first sub-program of the plurality of sub-programs from a first compiler of the plurality of compilers;

combine, at the compiler in the hypervisor, the plurality of sub-programs having the update to the first sub-program into an updated monolithic program;

generate, by the compiler in the hypervisor, an updated circuit implementation for the updated monolithic program; and load, by the compiler in the hypervisor, the updated circuit implementation to the programmable device.

17. The virtualized computing system of claim 15, wherein the software platform is configured to:

receive, at the compiler in the hypervisor, a completion indication from a first compiler of the plurality of compilers;

combine, at the compiler in the hypervisor, the plurality of sub-programs other than a first sub-program received from the first compiler into an updated monolithic program;

generate, by the compiler in the hypervisor, an updated circuit implementation for updated monolithic program; and load, by the compiler in the hypervisor, the updated circuit implementation to the programmable device.

18. The virtualized computing system of claim 15, wherein the software platform is configured to generate the monolithic program by:

generating, by the compiler in the hypervisor, a control statement from procedural logic in the monolithic program using a first set of transformations;

modifying, by the compiler in the hypervisor, the control statement to be compatible with a selected application binary interface (ABI) using a second set of transformations; and grouping, by the compiler in the hypervisor, a body of the control statement into states of a state machine using a third set of transformations.

19. The virtualized computing system of claim 15, wherein the software platform is configured to:

receive, at the compiler in the hypervisor, application binary interface (ABI) requests from the plurality of compilers; and schedule, by the compiler in the hypervisor, the ABI requests to the circuit implementation sequentially.

20. The virtualized computing system of claim 15, wherein the software platform is configured to:

receive, at the compiler in the hypervisor, a compilation request from a first compiler of the plurality of compilers;

request, by the compiler in the hypervisor to the plurality of compilers, an interrupt;

receive, at the compiler from the plurality of compilers in response to the interrupt, requests for states of the plurality of sub-circuits in the circuit implementation;

modify, by the compiler in the hypervisor, the monolithic program based on the compilation request and loading an updated circuit implementation to the programmable device; and receive, at the compiler from the plurality of compilers, requests to restore states of the plurality of sub-circuits in the updated circuit implementation.

* * * * *